United States Patent
Lee et al.

[19]

[11] Patent Number: 6,080,680
[45] Date of Patent: Jun. 27, 2000

[54] METHOD AND COMPOSITION FOR DRY ETCHING IN SEMICONDUCTOR FABRICATION

[75] Inventors: Changhun Lee, Fremont; Yun-Yen Jack Yang, San Jose, both of Calif.

[73] Assignee: Lam Research Corporation, Fremont, Calif.

[21] Appl. No.: 08/994,552

[22] Filed: Dec. 19, 1997

[51] Int. Cl.$^7$ ............................................. H01L 21/461
[52] U.S. Cl. .......................... 438/727; 216/69; 216/72; 216/75
[58] Field of Search .................................. 438/710, 714, 438/723, 725, 726, 727, 734, 736, 737, 738, 742, 443; 216/69, 72, 75, 79, 80

[56] References Cited

U.S. PATENT DOCUMENTS

| | | | |
|---|---|---|---|
| 4,673,456 | 6/1987 | Spencer et al. | 156/345 |
| 4,699,689 | 10/1987 | Bersin | 438/709 |
| 4,938,839 | 7/1990 | Fujimara et al. | 438/514 |
| 4,983,254 | 1/1991 | Fujimara et al. | 216/67 |
| 5,174,856 | 12/1992 | Hwang et al. | 216/69 |
| 5,201,994 | 4/1993 | Nonaka et al. | |
| 5,221,424 | 6/1993 | Rhoades | 216/13 |
| 5,269,879 | 12/1993 | Rhoades et al. | 438/694 |
| 5,298,112 | 3/1994 | Hayasaka et al. | 216/67 |
| 5,472,564 | 12/1995 | Nakamura et al. | 216/51 |
| 5,545,289 | 8/1996 | Chen et al. | 438/694 |
| 5,658,425 | 8/1997 | Halman et al. | 438/620 |
| 5,824,604 | 10/1998 | Bar-Gadda | 438/725 |

FOREIGN PATENT DOCUMENTS

WO 97/41488  11/1987  WIPO .

OTHER PUBLICATIONS

Abstract from Japanese Application 62271302, Shinagawa Keisuke, Publication No. 01112733, published May 1, 1989.

Abstract from Japanese Application 61247033, Nonaka Mikio, Publication No. 63102232, published May 7, 1988.

Hartney, M.A., Hess, D.W., Soane, D.S. "Oxygen Plasma Etching for Resist Stripping and Multilayer Lithography" *J. Vac. Sci. Technology* B7(1) (Jan./Feb. 1989): 1–13.

*Primary Examiner*—Handy Gulakowski
*Assistant Examiner*—Allan Olsen
*Attorney, Agent, or Firm*—Burns, Doane, Swecker & Mathis, L.L.P.

[57] ABSTRACT

Methods and compositions for improving etch rate selectivity of photoresist to substrate material in a downstream microwave dry stripping process in the fabrication of semiconductor integrated (IC) circuits are provided. Significant improvement in selectivity is demonstrated with the addition of $N_2$ to an etchant gas mixture of $O_2$ and $CF_4$.

22 Claims, 4 Drawing Sheets

METHOD AND COMPOSITION FOR DRY ETCHING IN SEMICONDUCTOR FABRICATION

FIELD OF THE INVENTION

The present invention relates generally to a method for improving etch rate selectivity of photoresist to substrate material in a downstream microwave dry stripping process in the fabrication of semiconductor integrated (IC) circuits. Significant improvement in selectivity has been achieved by the addition of $N_2$ to an etchant gas mixture of $O_2$ and $CF_4$.

BACKGROUND OF THE RELATED ART

In semiconductor IC fabrication, devices such as component transistors are formed on a semiconductor wafer or substrate, which is typically made of silicon. Metallic interconnect lines, which are etched from a metal layer disposed above the wafer, may then be employed to couple the devices together to form the desired circuit. These metal layers are typically made of aluminum, copper, or an aluminum alloy. Conventional metal etchants usually contain chlorine ($Cl_2$), which is highly selective for aluminum, and etchants include, for example, $BCl_3/Cl_2$, $HCl/Cl_2$, $BCl_3/Cl_2/SF_6$.

The etched layer stack is then subject to a strip process to remove the photoresist that was applied prior to the metal etch to cover areas of the layer stack which are not to be etched. Stripping may be conducted with a plasma asher. In this device, $O_2$ is excited into a plasma which dissociates the $O_2$ into various oxygen radical and ion species that oxidize (ash) the photoresist.

The introduction of highly reactive fluorine-containing gases into an oxygen plasma not only increases the photoresist ash rate but also enhances polymer removal. Higher ash rates are evident even with the addition of a small amount of $CF_4$ to an $O_2$-based plasma. The reason is that $CF_4$ significantly increases the atomic oxygen concentration which enhances the ash rate of photoresist. Atomic fluorine is also known as a very effective chemical species for removing the polymers formed during the metal etch process. Since these composite polymers are highly nonvolatile and etch resistant, $O_2$-based plasmas employing etchant gas such as, for example, $O_2$, $O_2/N_2$, $O_2/H_2O$, $O_2/N_2/H_2O$ are ineffective for removing these polymers. Often they cannot be completely removed even by the aggressive chemical solvents. The composite polymer or sidewall polymer typically forms on the vertical walls of the etched layer stack. These polymers are composite byproducts comprising carbon (e.g., from the photoresist), metal, oxides, aluminum silicate, and fluorocarbons. Composite polymers form fences against the via walls that are difficult to remove.

Despite the advantages, there is a major drawback associated with fluorine chemistry. Due to the aggressiveness nature of highly reactive fluorine species, $CF_4$ added $O_2$ plasma not only etches targeted photoresist but it also attacks barrier and underlying materials, e.g., Ti, TiN, TiW, and $SiO_2$. Excess loss of these materials results in significant reduction in photoresist etch selectivity. Thus, removing the photoresist and composite polymer with minimum undercutting remains a key factor for a successful process development.

SUMMARY OF THE INVENTION

The present invention is based in part on the discovery that dry etching of photoresist and sidewall polymer with an etchant gas mixture comprising $O_2$, a fluorine containing gas and $N_2$ exhibits exceptionally high selectivity in microwave-based strippers. Specifically, it was found that the addition of $N_2$ gas to an $O_2/CF_4$ plasma resulted in a dramatic increase in selectivity of photoresist relative to barrier and underlying materials.

In one aspect, the invention is directed to a method of removing photoresist from a semiconductor wafer that includes the steps of:

positioning said wafer into a chamber wherein the wafer includes photoresist;

introducing effective amounts of an etchant gas mixture comprising $O_2$, a fluorine containing gas, and $N_2$ into the chamber; and decomposing said etchant gas mixture with microwave radiation and plasma phase reacting the decomposed gases with the photoresist.

In another aspect the invention is directed to a method of treating a semiconductor wafer, comprising a layer of photoresist and composite polymer, following metal etching which includes the steps of:

positioning the semiconductor wafer in a plasma reaction chamber following metal etching; and treating said semiconductor wafer stack with etchant gas mixture that comprises $O_2$, a fluorine containing gas, and $N_2$.

In a further aspect method the invention is directed to a plasma processing system including a vacuum chamber, a source of microwave radiation, and an etchant gas composition for dry etching photoresist from a semiconductor wafer stack with minimal undercutting of metal barrier and oxide layers, said composition consisting essentially of $O_2$, a fluorine containing gas, and $N_2$.

In a preferred embodiment, the semiconductor wafer includes an underlying oxide layer and a metal barrier layer and the introduction of the $N_2$ to reduces the rate at which the underlying oxide and barrier layers are etched.

DETAILED DESCRIPTION OF THE PREFERRED EMBODIMENTS

Figure 1:
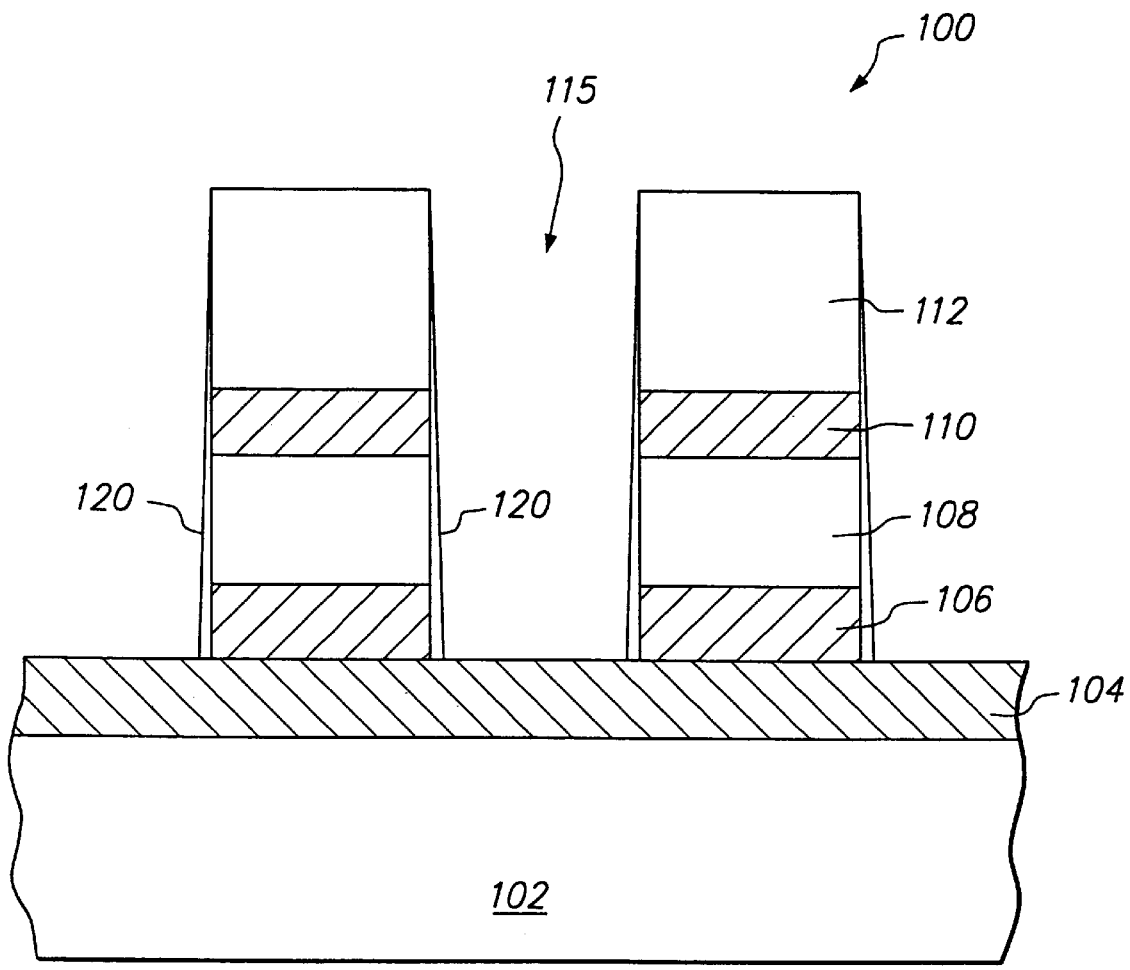
FIG. 1 illustrates a cross-sectional view of a layer stack, following metal etch and before strip, representing the layers formed during the fabrication of a typical semiconductor IC.

FIG. 1 illustrates a cross-sectional view of a layer stack 100, representing the layers formed during the processing of a typical substrate, e.g., one that may be employed to fabricate integrated circuits or flat panel displays. FIG. 1 depicts the layer stack after conventional metal etching has been completed, but before passivation and strip treatment. It should be noted that other additional layers above, below, or between the layers shown may be present. Further, not all of the shown layers need necessarily be present and some or all may be substituted by other different layers.

At the bottom of layer stack 100, there is shown a substrate 102, typically composed of silicon. An oxide layer 104, typically comprising $SiO_2$, is formed above substrate 102. As noted above, additional layers (not shown) may be interposed between the substrate 102 and the oxide layer 104. One or more barrier layers 106 typically formed of Ti, TiN, TiW or other suitable barrier materials, may be disposed between oxide layer 104 and a subsequently deposited metal layer 108. Barrier layer(s) 106, when provided, functions to prevent the diffusion of silicon atoms from oxide layer 104 into the metal layer 108.

Metal layer 108 typically comprises tungsten, aluminum or one of the known aluminum alloys such as Al—Cu, Al—Si, or Al—Cu—Si. For convenience, the metal layer 108 is referred to herein as the aluminum layer although it should be understood that any of the aforementioned aluminum alloys can be used. The remaining two layers of the stack include an antireflective coating (ARC) layer 110 and an overlaying photoresist (PR) layer 112 are formed atop metal layer 108. The ARC layer 110, typically comprising TiN, TiW or other suitable material, helps prevent light (e.g., from the lithography step that patterns the photoresist) from being reflected and scattered off the surface of the metal layer 108. Photoresist layer 112 represents a layer of conventional positive photoresist material (typically I-line) which may be patterned for etching, e.g., through exposure to ultra-violet radiation. Composite or sidewall polymer byproducts forms fence structures 120 on the walls of the device.

Typically the oxide layer 102 has a thickness of about 500 to 1000 nm, the barrier layer 106 has a thickness of about 30 to 300 nm, the metal layer 108 has a thickness of about 300 to 1000 nm, the antireflective layer 110 has a thickness of about 30 to 200 nm, and the photoresist layer has a thickness of about 1 to 2 $\mu$m.

The layers of layer stack 100 are readily recognizable to those skilled in the art and may be formed using any of a number of suitable and known deposition processes, including sputtering, chemical vapor deposition (CVD), plasma-enhanced chemical vapor deposition (PECVD), and physical vapor deposition (PVD).

To form the aforementioned metallic interconnect lines, a portion (indicated by arrow 115) of the layers of the layer stack, including metal layer 108, are etched using a suitable plasma source. By way of example, the process involves the patterning of photoresist layer 112 by exposing the photoresist material in a lithography system, and the development of the photoresist material to form a mask to facilitate subsequent etching. Using an appropriate etchant, the areas of the metal layer that are unprotected by the mask are then etched away, leaving behind metal interconnect lines or features.

Following metal etch, a chlorine residue that is an etched by-product may remain on the metal features of the layer stack. Unless it is removed, this chlorine residue may cause corrosion of the metal layer when the layer stack is exposed to air. Therefore, the layer stack is preferably subjected to a passivation treatment using $H_2O$ or a $H_2O/O_2$ mixture in a plasma environment to remove the chlorine residue. A typical conventional passivation process removes the chlorine etchant residue in approximately 30–60 s. The rate at which the photoresist is removed by the strip process is referred to as the "strip rate."

Figure 2:
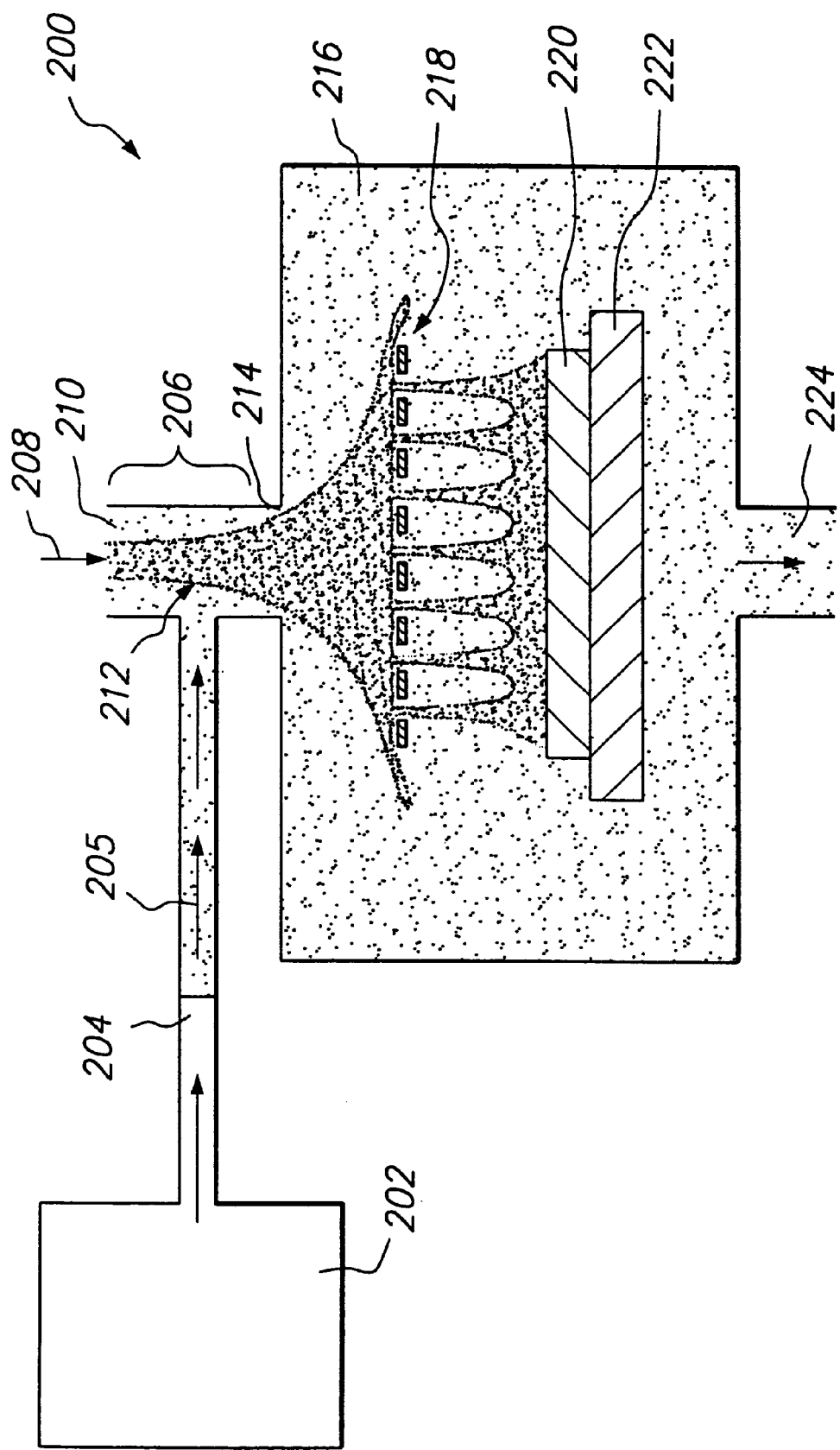
FIG. 2 is a simplified schematic diagram of a microwave plasma stripper that may be suitably employed with the inventive strip technique.

The inventive dry etching process for removing photoresist and/or composite polymer from a layer stack employs microwave radiation to generate the plasma. A suitable microwave stripper, such as that illustrated in FIG. 2 can be employed. As generally illustrated, microwave stripper 200 includes a microwave generator 202 operating at a frequency, for example, of 2.45 GHz, and preferably having a power in the range of about 500–1500 W, more preferably in the range of about 1000–1500 W, and most preferably of about 1250 W. The microwaves, represented by arrow 205, produced at generator 202 are propagated through waveguide 204 to plasma applicator 206. A source process gas, represented by arrow 208, flows through port 210 and into plasma applicator 206, where it is excited by the microwaves 205 to form a plasma 212 which flows through port 214 into process chamber 216. The total flow rate of the source process gas is preferably in the range of about 500–6000 standard cubic centimeter per minute (sccm), more preferably in the range of about 2000–5000 sccm, and most preferably about 4000 sccm. The composition of source process gasses according to various embodiments of the present invention is described herein.

Inside the process chamber 216, the plasma is preferably distributed by a baffle 218 before flowing onto the substrate 220 where it passivates and/or strips the layer stack (not shown). The substrate is positioned within the process chamber 216 on a bottom electrode 222 which is resistively heated to maintain a chuck temperature preferably in the range of about 180–300° C., more preferably in the range of about 225–275° C., and most preferably at about 240–250° C. The pressure in the process chamber is preferably maintained in the range of about 0.5≠6 Torr, more preferably in the range of about 1–3 Torr, and most preferably at about 2 Torr. The waste products generated by the passivation and strip are pumped out through exhaust port 224.

A preferred microwave source is a chemical plasma source ("CPS") that is manufactured by Applied Science and Technology, Inc. of Woburn, Mass. Although one preferred implementation of the present invention has been described above, those of skill in the art will recognize that the invention may be implemented in other microwave plasma systems.

The source process gasses suitable for dry etching is an etchant gas mixture comprising $O_2$, $N_2$, and a fluorine containing component which preferably is $CF_4$. It is expected that other suitable fluorine containing components include, for example, other fluorocarbons, e.g, $C_2F_6$, and possibly $NF_3$. The presence of $N_2$ enhances the selectivity with respect to the photoresist material as compared to the barrier and underlying materials. The term "selectivity" with respect to photoresist material as compared to a second material is defined as the ratio of photoresist etch rate to that of the second material.

The $O_2$ typically comprises about 40 to 99%, preferably about 60 to 95%, and more preferably about 70 to 90% by volume of the etchant gas mixture. The fluorine containing component typically comprises about 0.5 to 30%, preferably about 2.5 to 20%, and more preferably about 5 to 15% by volume of the etchant gas mixture. The $N_2$ typically comprises about 0.5 to 30%, preferably about 2.5 to 20%, and more preferably about 5 to 15% by volume of the etchant gas mixture. As is apparent the total flow rate of the etchant gas mixture employed in the microwave stripper will depend on the size and operating parameters of the device.

Silicon wafers having different materials formed on their surfaces were fabricated and etched under the same conditions to demonstrate selectivity of the inventive process. Specifically, for each silicon wafer, a layer comprising one of the following materials was formed thereon: $SiO_2$ (800 nm thick), TiN (80 nm), Ti (80 nm), TiW (80 nm), W (100 nm), and photoresist (1.6 μm).

Following formation of the layer stacks, the stacks were placed in the above described microwave stripper which operated at a pressure of 2 Torr and 1000 W. The etchant gas mixture flow rate was 4 l/m and the stacks were maintained at 250° C. Different etchant gas mixtures containing $O_2$ and $CF_4$ (5%) with varying amounts of $N_2$ (or $H_2O$ as a comparison) were employed.

Figure 3:
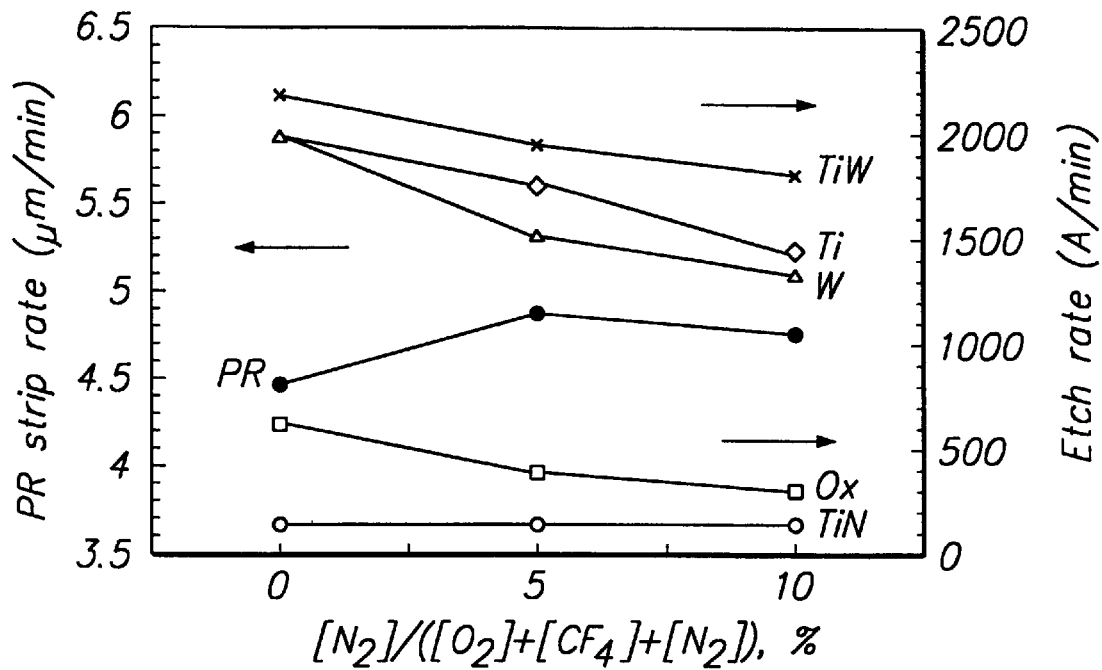
FIGS. 3 and 4 are graphs showing the effects of adding $N_2$ or $H_2O$, respectively, to an $O_2O/CF_4$ etchant mixture on the photoresist strip rate and barrier and underlying materials etch rates.
Figure 4:
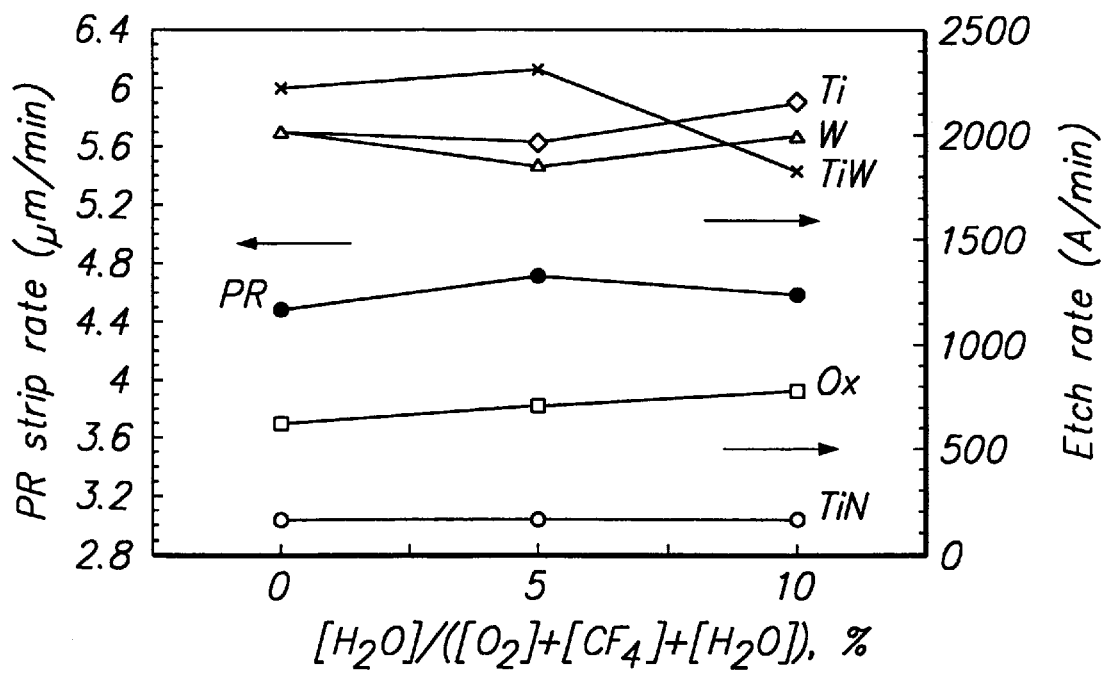

FIGS. 3 and 4 are test results showing changes in photoresist strip rates and metal and oxide etch rates in dry etching caused by adding either $N_2$ gas or $H_2O$ vapor to the $O_2/CF_4$ etchant gas mixture.

As is apparent from FIG. 3, which depicts the effect of $N_2$, the addition of $N_2$ decreased the etch rate of the metal layers and silicon oxide with the exception that the etch rate for TiN remained relatively constant. The photoresist strip rate initially increased to a maximum when the $N_2$ was about 5% (vol.) but gradually decreases with the addition of more $N_2$. As a comparison $H_2O$ vapor was added instead of $N_2$ in an otherwise identical stripping process and the results are shown in FIG. 4. The photoresist strip rate and TiN etch rate showed similar trends as in the case of $N_2$, but the etch rates for the other underlying materials namely, Ti, TiW, and W and the oxide did not follow the same trend with the addition of $H_2O$. Specifically, for Ti and W there was an initial decrease followed by an increase in etch rates. Conversely, for TiW, there was an initial increase followed by a decrease in etch rate. Finally, the oxide etch rate showed a gradual increase through the range tested.

Figure 5:
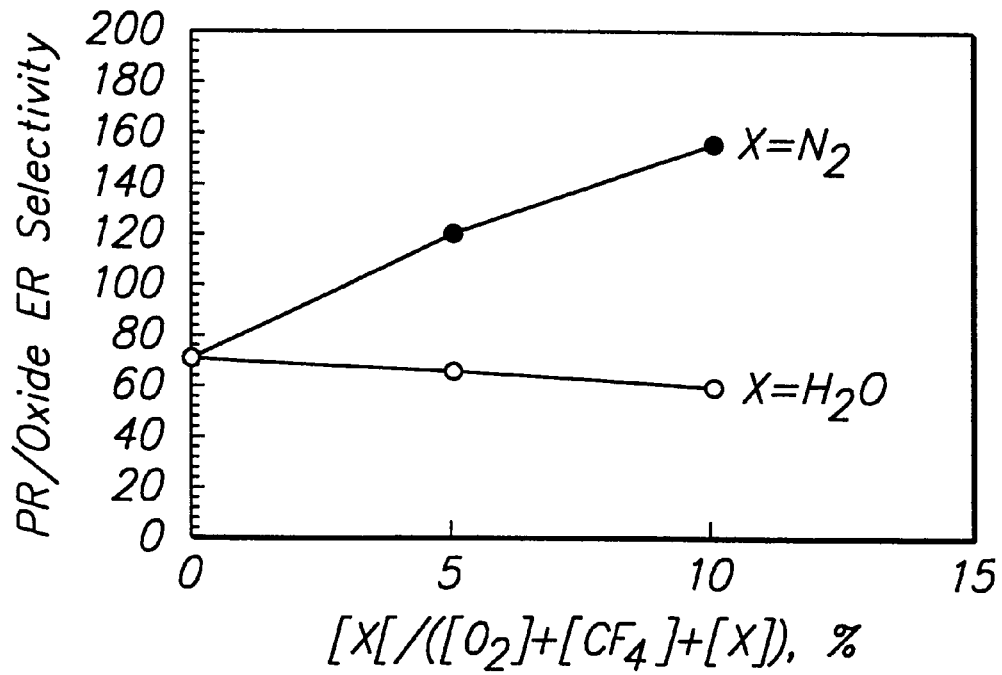
FIGS. 5 and 6 are graphs showing the effects of adding $N_2$ or $H_2O$, respectively, to an $O_2O/CF_4$ etchant mixture on photoresist/oxide and photoresist/TiN selectivities.
Figure 6:
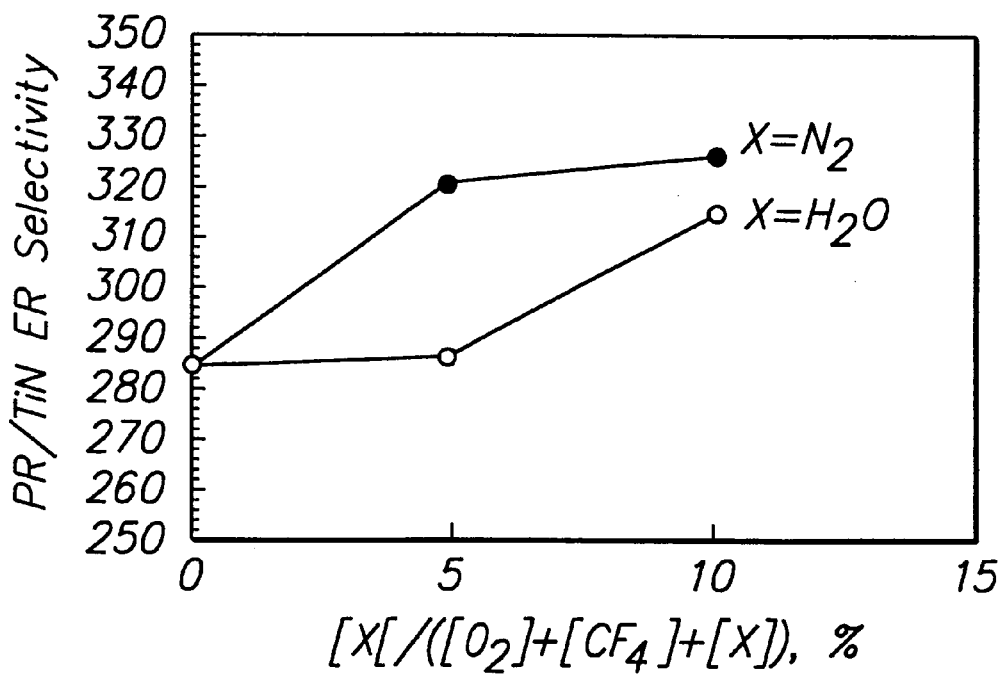

FIG. 5 shows the effect on the photoresist to oxide selectivity in relation to the amount of $N_2$ or $H_2O$ present in the etchant gas mixture for the above described comparative tests. The photoresist to oxide selectivity improved rather dramatically with the addition of $N_2$ whereas the selectivity exhibited a slight decrease with the addition of $H_2O$. Similarly, FIG. 6 shows the effect on the photoresist to TiN selectivity in relation to the amount of $N_2$ or $H_2O$ present in the etchant gas mixture. The photoresist to TiN selectivity initially improved dramatically and continued to improved although at a lesser rate with the addition of $N_2$. The selectivity exhibited a slight initial increase followed by a dramatic increase with the addition of $H_2O$.

Layer stacks having the structures shown in FIG. 1 were fabricated on silicon wafers. Specifically, the oxide, barrier, metal, ARC, and photoresist layers comprised the following materials and thicknesses: $SiO_2$ (800 nm)/Ti (20 nm) and TiN (50 nm)/Al (800 nm)/TiN (60 nm)/PR (1.2 μm). In this case, the barrier layer comprised a layer of Ti and a layer of TiN. Following formation of a layer stack having the above materials, the stacks were metal etched in a LAM 9600 Transformer Coupled Plasma (TCP)™ reactor from Lam Research Corp. of Fremont, Calif. to form structures similar to those of FIG. 1. Thereafter, photoresist and composite polymer removal was accomplished using the above described microwave stripper using etchant mixtures comprising (1) $O_2$ and $CF_4$ or (2) $O_2$, $CF_4$, and $N_2$. Scanning electron micrographs showed that the addition of $N_2$ significantly reduced undercutting, i.e., attack of the Ti/TiN barrier metal.

The inventive method will typically remove photoresist at a stripper rate etched at a rate of at least about 2 μm per minute, and preferably about 3 to 6 μm per minute. Moreover, the selectivity with respect to photoresist as compared to the underlying oxide layer will be at least 80 to 1 and for an underlying layer comprising $SiO_2$ the ratio will preferably range from about 80 to 1 to about 200 to 1. Furthermore, the selectivity with respect to photoresist as compared to the metal barrier layer layer will be at least 280 to 1 and for an barrier layer comprising a metal that is selected from the group consisting of Ti, TiN, TiW, and mixtures thereof, the ratio will preferably range from about 280 to 1 to about 350 to 1.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of treating a semiconductor wafer following metal etching which comprises the steps of:
   (a) positioning the semiconductor wafer in a plasma reaction chamber following metal etching wherein the semiconductor wafer comprises (i) an underlying oxide layer, (ii) a metal barrier layer, (iii) a metal layer, (iv) a photoresist layer and (v) a composite polymer that is attached to a side walls of the metal barrier layer and the metal layer; and
   (b) dry etching to remove the photoresist that consists of treating said semiconductor wafer with an etchant gas mixture that consists essentially of $O_2$, a fluorine containing gas, and $N_2$ wherein the etchant gas mixture is decomposed with microwave radiation until the photoresist layer and the composite polymer are removed, and wherein the amount of $N_2$ added enhances the selectivity with respect to the photoresist layer relative to the underlying oxide layer and metal barrier layer.

2. The method of claim 1 wherein the semiconductor wafer includes an underlying oxide layer and the step of dry etching introduces a sufficient amount of $N_2$ to reduce the rate at which the underlying oxide is etched.

3. The method of claim 2 wherein the step of dry etching removes the photoresist at a first rate and removes the underlying oxide layer at a second rate and the ratio of the first rate to the second rate is equal to at least 80 to 1.

4. The method of claim 3 wherein underlying oxide layer comprises $SiO_2$ and the ratio ranges from about 80 to 1 to about 200 to 1.

5. The method of claim 1 wherein the semiconductor wafer includes a metal barrier layer and the step of dry etching introduces a sufficient amount of $N_2$ to reduce the rate at which the metal barrier layer is etched.

6. The method of claim 5 wherein the step of dry etching removes the photoresist at a first rate and removes the metal barrier layer at a second rate and the ratio of the first rate to the second rate is equal to at least 280 to 1.

7. The method of claim 6 wherein the metal barrier layer comprises materials selected from the group consisting of Ti, TiN, TiW, and mixtures thereof and wherein the ratio ranges from about 280 to 1 to about 350 to 1.

8. The method of claim 1 wherein the $O_2$ comprises about 40 to 99% by volume of the etchant gas mixture, the fluorine containing gas comprises about 0.5 to 30% by volume of the etchant gas mixture, the $N_2$ comprises about 0.5 to 30% by volume of the etchant gas mixture.

9. The method of claim 8 wherein the fluorine containing gas is $CF_4$.

10. The method of claim 1 wherein the step of dry etching etches the photoresist at a rate of at least about 2 μm per minute.

11. The method of claim 1 wherein the plasma reaction chamber that is maintained at a pressure of about 0.5 to 6 Torr.

12. A method of treating a semiconductor wafer following metal etching which comprises the steps of:
- (a) positioning the semiconductor wafer in a plasma reaction chamber following metal etching wherein the semiconductor wafer comprises (i) an underlying oxide layer, (ii) a metal barrier layer, (iii) a metal layer, (iv) a photoresist layer and (v) a composite polymer that is attached to a side walls of the metal barrier layer and the metal layer;
- (b) subjecting the semiconductor wafer to passivation treatment by exposing the semiconductor wafer to $H_2O$ or an $H_2O$ and $O_2$ mixture to remove chlorine residue therefrom; and, thereafter
- (c) dry etching to remove the photoresist that consists of treating said semiconductor wafer with an etchant gas mixture that consists essentially of $O_2$, a fluorine containing gas, and $N_2$ wherein the etchant gas mixture is decomposed with microwave radiation until the photoresist layer and the composite polymer are removed, and wherein the amount of $N_2$ added enhances the selectivity with respect to the photoresist layer relative to the underlying oxide layer and metal barrier layer.

13. The method of claim 12 wherein the semiconductor wafer includes an underlying oxide layer and the step of dry etching introduces a sufficient amount of $N_2$ to reduce the rate at which the underlying oxide is etched.

14. The method of claim 13 wherein the step of dry etching removes the photoresist at a first rate and removes the underlying oxide layer at a second rate and the ratio of the first rate to the second rate is equal to at least 80 to 1.

15. The method of claim 14 wherein underlying oxide layer comprises $SiO_2$ and the ratio ranges from about 80 to 1 to about 200 to 1.

16. The method of claim 12 wherein the semiconductor wafer includes a metal barrier layer and the step of dry etching introduces a sufficient amount of $N_2$ to reduce the rate at which the metal barrier layer is etched.

17. The method of claim 16 wherein the step of dry etching removes the photoresist at a first rate and removes the metal barrier layer at a second rate and the ratio of the first rate to the second rate is equal to at least 280 to 1.

18. The method of claim 17 wherein the metal barrier layer comprises materials selected from the group consisting of Ti, TiN, TiW, and mixtures thereof and wherein the ratio ranges from about 280 to 1 to about 350 to 1.

19. The method of claim 12 wherein the $O_2$ comprises about 40 to 99% by volume of the etchant gas mixture, the fluorine containing gas comprises about 0.5 to 30% by volume of the etchant gas mixture, the $N_2$ comprises about 0.5 to 30% by volume of the etchant gas mixture.

20. The method of claim 19 wherein the fluorine containing gas is $CF_4$.

21. The method of claim 12 wherein the step of dry etching etches the photoresist at a rate of at least about 2 μm per minute.

22. The method of claim 12 wherein the plasma reaction chamber that is maintained at a pressure of about 0.5 to 6 Torr.

* * * * *